(12) United States Patent
Zeng et al.

(10) Patent No.: US 8,525,477 B2
(45) Date of Patent: Sep. 3, 2013

(54) ASSIGNING ADDRESSES TO MULTIPLE CASCADE BATTERY MODULES IN ELECTRIC OR ELECTRIC HYBRID VEHICLES

(75) Inventors: Xiaojun Zeng, Shanghai (CN); Falong Li, Shanghai (CN); Guoxing Li, Sunnyvale, CA (US)

(73) Assignee: O2Micro, Inc., Santa Clara, CA (US)

( * ) Notice: Subject to any disclaimer, the term of this patent is extended or adjusted under 35 U.S.C. 154(b) by 339 days.

(21) Appl. No.: 12/836,632

(22) Filed: Jul. 15, 2010

(65) Prior Publication Data

US 2011/0140533 A1 Jun. 16, 2011

(51) Int. Cl.
*H02J 7/00* (2006.01)

(52) U.S. Cl.
USPC ............ 320/116; 320/106; 320/118; 320/134

(58) Field of Classification Search
USPC .................................. 320/106, 116, 118, 134
See application file for complete search history.

(56) References Cited

U.S. PATENT DOCUMENTS

| | | |
|---|---|---|
| 4,580,261 A | 4/1986 | Pelotte |
| 4,716,354 A | 12/1987 | Hacker |
| 4,723,241 A | 2/1988 | Grobel et al. |
| 4,773,005 A | 9/1988 | Sullivan |
| 4,962,378 A | 10/1990 | Fadem |
| 5,282,193 A | 1/1994 | Iino et al. |
| 5,423,050 A | 6/1995 | Taylor et al. |
| 5,504,413 A | 4/1996 | Fernandez et al. |
| 5,701,068 A | 12/1997 | Baer et al. |
| 5,841,996 A | 11/1998 | Nolan et al. |
| 5,850,351 A | 12/1998 | Lotfy et al. |
| 5,974,475 A | 10/1999 | Day et al. |
| 5,998,967 A * | 12/1999 | Umeki et al. ................. 320/122 |
| 6,031,354 A | 2/2000 | Wiley et al. |
| 6,094,053 A | 7/2000 | Harvey |

(Continued)

FOREIGN PATENT DOCUMENTS

| | | |
|---|---|---|
| CN | 1319189A A | 10/2001 |
| CN | 1855606 A | 11/2006 |

(Continued)

OTHER PUBLICATIONS

Office Action mailed Jan. 13, 2011 from related U.S. Appl. No. 12/872,432.

(Continued)

*Primary Examiner* — M'Baye Diao
(74) *Attorney, Agent, or Firm* — Dentons US LLP (57) ABSTRACT

According to one aspect there is disclosed an apparatus. The apparatus may include a first battery module. The first battery module may include a switch configured to open or close a first current path from a first terminal of a battery to a second terminal of the battery when a second battery module is coupled to the first battery module; a current sensor configured to sense a current in a second current path, the second current path different from the first current path; and a local controller configured to control a state of the switch to open or close the switch, wherein closing the switch is configured to close the first current path, the local controller is further configured to detect the sensed current in the second current path, and the local controller is further configured to receive and store an identifier based at least in part on the current detected in the second current path.

19 Claims, 7 Drawing Sheets

(56) References Cited

U.S. PATENT DOCUMENTS

| | | |
|---|---|---|
| 6,172,479 B1 | 1/2001 | Barton |
| 6,281,684 B1 | 8/2001 | James |
| 6,404,166 B1 | 6/2002 | Puchianu |
| 6,462,510 B1 | 10/2002 | Takada et al. |
| 6,611,774 B1 | 8/2003 | Zaccaria |
| 6,762,588 B2 | 7/2004 | Miyazaki |
| 7,020,076 B1 | 3/2006 | Alkalai et al. |
| 7,023,845 B1 | 4/2006 | Simons et al. |
| 7,034,540 B2 | 4/2006 | Anzawa et al. |
| 7,466,104 B2 | 12/2008 | Wang et al. |
| 7,489,030 B2 | 2/2009 | Shibata et al. |
| 7,511,457 B2 | 3/2009 | Emori et al. |
| 7,533,106 B2 | 5/2009 | Magdeburger et al. |
| 7,615,966 B2 | 11/2009 | Houldsworth et al. |
| 7,733,059 B2 | 6/2010 | Yoshida |
| 7,760,106 B2 | 7/2010 | Vandensande et al. |
| 8,015,452 B2 | 9/2011 | Li |
| 8,227,944 B2 | 7/2012 | Li |
| 8,237,405 B2 | 8/2012 | Li |
| 2001/0037482 A1 | 11/2001 | Plants |
| 2004/0019441 A1 | 1/2004 | Larson |
| 2004/0164706 A1 | 8/2004 | Osborne |
| 2004/0225810 A1 | 11/2004 | Hiratsuka |
| 2004/0251874 A1 | 12/2004 | Petitdidier et al. |
| 2005/0271077 A1 | 12/2005 | Hartzsch |
| 2005/0275338 A1 | 12/2005 | Lee et al. |
| 2005/0275389 A1 | 12/2005 | Cordoba |
| 2006/0072262 A1 | 4/2006 | Paik et al. |
| 2006/0136609 A1 | 6/2006 | Vladimir |
| 2006/0259280 A1 | 11/2006 | Zaccaria |
| 2007/0182377 A1 | 8/2007 | Vandensande |
| 2008/0088277 A1 | 4/2008 | Wang et al. |
| 2009/0144471 A1 | 6/2009 | Lin |
| 2010/0173180 A1 | 7/2010 | Li |
| 2010/0259221 A1 | 10/2010 | Tabatowski-Bush |
| 2011/0012638 A1 | 1/2011 | Shuler |
| 2011/0309799 A1* | 12/2011 | Firehammer ............... 320/134 |
| 2011/0313613 A1* | 12/2011 | Kawahara et al. ............ 701/29 |
| 2012/0013201 A1 | 1/2012 | Pariseau et al. |

FOREIGN PATENT DOCUMENTS

| | | |
|---|---|---|
| CN | 2876850 Y | 3/2007 |
| CN | 101202463 A | 6/2008 |
| CN | 101331445 A | 12/2008 |
| JP | 11-206025 A | 7/1999 |
| JP | 2001-307782 A | 11/2001 |
| JP | 2003-111297 A | 4/2003 |
| JP | 2005-033951 A | 2/2005 |
| JP | 2007-158237 A | 6/2007 |
| JP | 2007-252175 A | 9/2007 |
| JP | 2007-335337 A | 12/2007 |
| JP | 2009-027916 A | 2/2009 |
| JP | 2010-146991 A | 7/2010 |
| WO | 9527358 | 10/1995 |
| WO | 0005596 A1 | 2/2000 |
| WO | 2006068429 A1 | 6/2006 |
| WO | 2009018124 A1 | 2/2009 |

OTHER PUBLICATIONS

Notice of Allowance mailed Apr. 14, 2011 from related U.S. Appl. No. 12/872,432.
EP Search Report dated Oct. 18, 2010 issued in related European Patent Application No. 10150165.8.
Notice of Allowance dated May 19, 2011 issued in related U.S. Appl. No. 12/872,432.
Notice of Allowance dated Nov. 4, 2011 issued in related U.S. Appl. No. 12/854,041.
Office Action dated Feb. 2, 2012 received in related U.S. Appl. No. 13/154,736.
European Search Report dated Jan. 16, 2012 issued in related European Patent Application No. 11175176.
Extended European Search Report for EP 2408053 dated May 3, 2013.
Chinese Office Action for Chinese Application No. 201110220724.3 dated May 30, 2013.
Chinese Office Action for Chinese Application No. 201010179342.6 dated Jun. 7, 2013.

* cited by examiner

ASSIGNING ADDRESSES TO MULTIPLE CASCADE BATTERY MODULES IN ELECTRIC OR ELECTRIC HYBRID VEHICLES

BACKGROUND

Battery Management Systems (BMSs) typically include a plurality of battery modules coupled in cascade in order to provide relatively high energy for Electric Vehicles (EVs) and/or Hybrid Electric Vehicles (HEVs). Each battery module typically includes a plurality of battery cells and circuitry configured to monitor a status of the battery cells and to communicate the status to, e.g., a remote control unit.

It is desirable for each battery module to be manufactured identically to each other battery module, providing savings in both manufacturing cost and the time to manufacture the modules. In operation, however, it may be desirable to individually address each battery module, e.g., in order to identify a particular battery module. It may also be desirable to assemble the plurality of battery modules into a battery management system without consideration of a relative position of each module in the system. Providing unique addresses at manufacturing can be done but adds time and cost to the manufacturing process. It may therefore be desirable to identify and assign unique addresses to battery modules after they have been assembled into a BMS.

SUMMARY

According to one aspect there is disclosed an apparatus. The apparatus may include a first battery module. The first battery module may include a switch configured to open or close a first current path from a first terminal of a battery to a second terminal of the battery when a second battery module is coupled to the first battery module; a current sensor configured to sense a current in a second current path, the second current path different from the first current path; and a local controller configured to control a state of the switch to open or close the switch, wherein closing the switch is configured to close the first current path, the local controller is further configured to detect the sensed current in the second current path, and the local controller is further configured to receive and store an identifier based at least in part on the current detected in the second current path.

According to another aspect there is disclosed a method for assigning identifiers to a plurality of battery modules. The method may include closing a switch in each battery module, wherein the switch is configured to open or close a first current path from a first terminal of a battery to a second terminal of the battery; detecting a current in each battery module, wherein the current is in a second current path different from the first current path; assigning an address to one battery module if the one battery module has detected zero current in the second current path, wherein the one module is configured to store the assigned address; opening the switch of the one battery module; and repeating the detecting, assigning and opening until the plurality of battery modules have been assigned addresses.

In yet another aspect there is disclosed a system. The system may include a plurality of battery modules. Each battery module may include a switch configured to open or close a first current path from a first terminal of a battery to a second terminal of the battery when another battery module is coupled to the battery module, a current sensor configured to sense a current in a second current path, the second current path different from the first current path, and a local controller configured to control a state of the switch to open or close the switch, wherein closing the switch is configured to close the first current path, the local controller is further configured to detect the sensed current in the second current path, and the local controller is further configured to receive and store an identifier based at least in part on the current detected in the second path. The system may further include a central controller coupled to a plurality of battery modules, the central controller is configured to provide a message to the local controller of each battery module, the message is configured to cause one or more of the local controllers to close its associated local switch and to detect the current in the second current path, the message is further configured to cause the local controller to store the identifier based at least in part on the detected current.

BRIEF DESCRIPTION OF DRAWINGS

Features and advantages of the claimed subject matter will be apparent from the following detailed description of embodiments consistent therewith, which description should be considered with reference to the accompanying drawings, wherein:

DETAILED DESCRIPTION

A system, apparatus and/or method consistent with the present disclosure are configured to identify each battery module of a plurality of battery modules in a battery management system (BMS) and to assign an address to each battery module. The system, apparatus and method may allow determination of how many battery modules are in the plurality of battery modules. The system, apparatus and/or method may allow determination of a position of each battery module relative to other battery modules in the BMS.

Figure 1A:
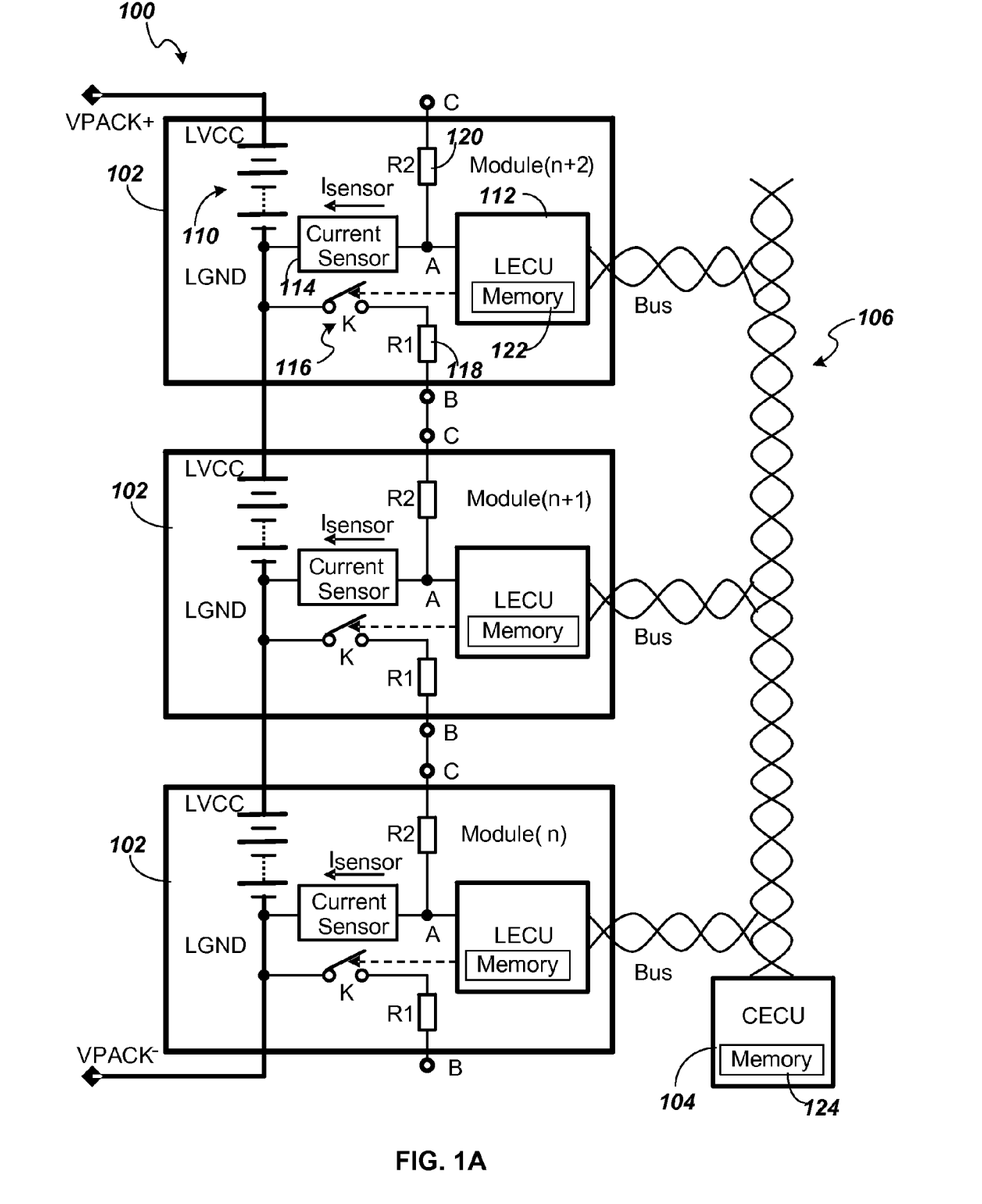
FIG. 1A depicts a block diagram of one embodiment of a system consistent with the present disclosure.
Figure 1B:
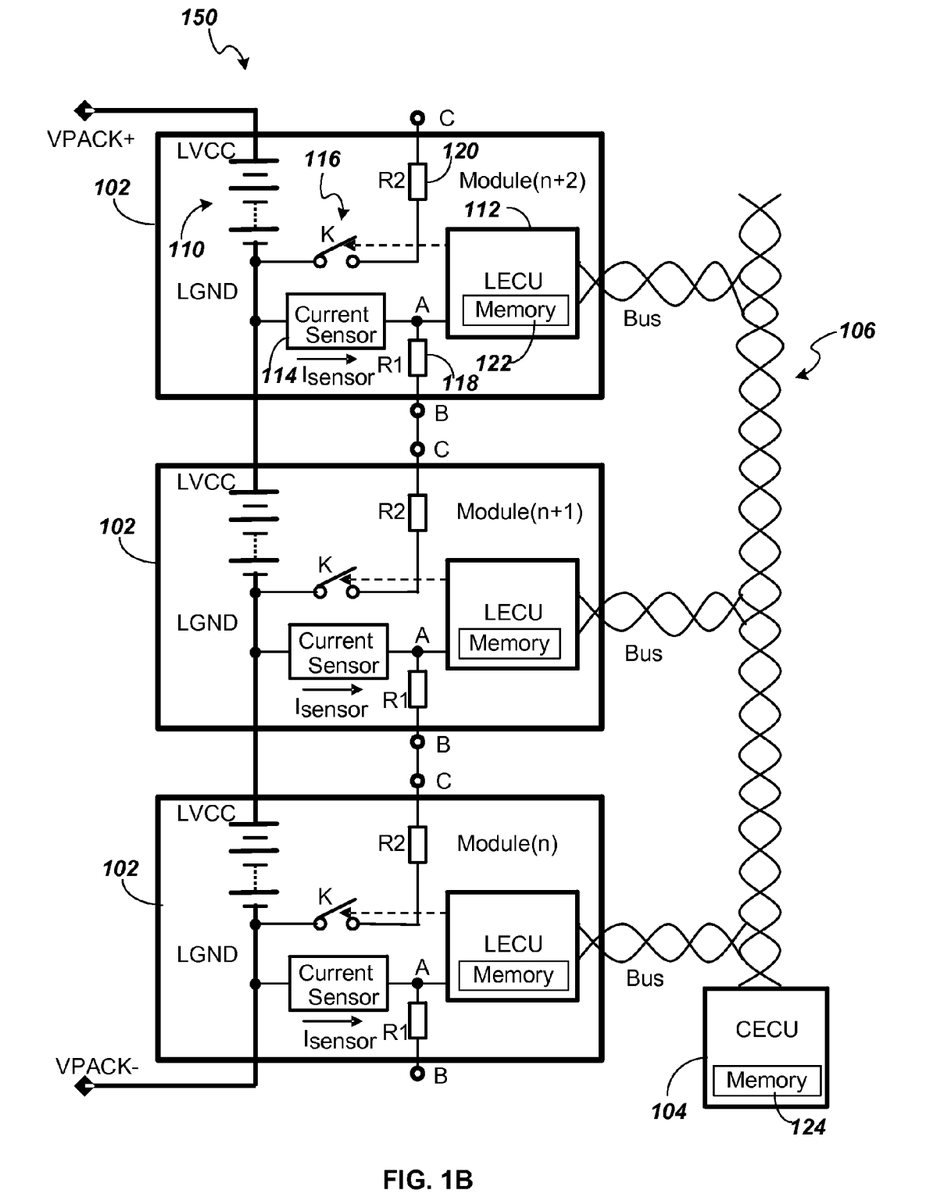
FIG. 1B depicts a block diagram of another embodiment of a system consistent with the present disclosure.

FIG. 1A depicts a block diagram of one embodiment of battery management system circuitry 100 consistent with the present disclosure. FIG. 1B depicts a block diagram of another embodiment of battery management system circuitry 150 consistent with the present disclosure. In the embodiments 100, 150, common elements have common reference designators. The embodiments include similar elements but differ in configuration of those elements, as described herein.

The battery management systems 100, 150 each include a plurality of battery modules. Each battery module 102 includes battery module circuitry. For example, each battery management system 100, 150 may include a plurality of battery modules: Module(n), Module(n+1), Module(n+2). Each battery module 102 is coupled to central controller circuitry, e.g., central electronic control unit (CECU) 104. For example, each battery module 102 may be coupled to the CECU 104 by a bus 106. The CECU 104 may include memory 124. For ease of description, a specific battery module will be referred herein to as "Module(x)" where x is n, n+1 or n+2, and an individual battery module that may be any of the plurality of battery modules will be referred to herein as "battery module 102".

The bus 106 is configured to provide communication between the CECU 104 and each battery module 102. The bus 106 may be a serial bus configured for serial communication. For example, the bus may be a CAN bus, as may be known to those skilled in the art. One or more messages may be communicated between the CECU 104 and one or more of the battery modules 102 using bus 106. A message may include commands, e.g., instructions, identifier(s) and/or data. For example, each message may include an identifier. The identifier may be, e.g., an address corresponding to an individual battery module 102, or an identifier corresponding to the plurality of battery modules. The identifier may correspond to the battery module(s) that are to receive the message and/or may be requested to respond to the message. For example, command may include an instruction to store the identifier, corresponding to an address to be associated with the battery module. Data may include the address to be assigned to the battery module 102. In another example, data may include a parameter associated with the battery module. Parameters include internal and/or external temperature, battery voltage and/or current associated with the battery module. A command may include other instructions as are evident those skilled in the art.

Each battery module 102 includes a plurality of battery cells ("battery") 110 coupled between a first terminal (LVCC) and a second terminal (LGND). For example, a battery 110 may include Lithium-Ion, NiMH (Nickel-Metal Hydride), Lead Acid, Fuel Cell, Super Capacitor, or some other energy storage technology. Each battery module includes local controller circuitry, e.g., local electronic control unit (LECU) 112, current sensor circuitry 114, switch circuitry 116 and one or more resistors, e.g., R1, R2 118, 120. Each resistor R1, R2 may be coupled to a port, e.g., R1 is coupled to port B and R2 is coupled to port C of the battery module 102. Each battery module 102 is configured to be coupled to at least one other battery module 102. For example, each port B is configured to be coupled to port C of an adjacent battery module. Each battery 110 is configured to be coupled to another battery in at least one adjacent battery module. For example, terminal LGND of Module (n+2) may be coupled to terminal LVCC of Module (n+1) and terminal LGND of Module (n+1) may be coupled to terminal LVCC of Module (n). In this example, LVCC of Module (n+2) may be coupled to Vpack+ and terminal LGND of Module (n) may be coupled to Vpack−. Each battery 110 has an associated voltage between terminal LVCC and terminal LGND and is configured to provide electrical energy, e.g., current, to a load coupled across Vpack+ and Vpack−. Although these examples include three modules, more or fewer modules may be included in a BMS, consistent with the present disclosure, as would be evident to one of ordinary skill in the art.

The LECU is configured to be coupled to bus 106. The LECU 112 is configured to monitor a status of the battery module 102 and/or battery 110 and/or to communicate with the CECU 104 over bus 106. The LECU 112 is configured to receive and store the identifier corresponding to the address of the battery module 102, as described herein. The LECU 112 may include memory 122 for storing the identifier. The CECU 104 is configured to assign the identifier to each battery module, as described herein. For example, the CECU 104 may transmit message(s) to one or more of the battery modules 102. Each LECU 112 may then receive message(s) from the CECU 104 and may respond only to message(s) that are directed to its associated address. Each LECU 112 is configured to respond to message(s) that include the identifier associated, i.e., assigned to, the particular battery module 102. In other words, each battery module 102 may be assigned a unique address relative to each other battery module in the BMS.

The LECU 112 is coupled to a node, Node A, of the battery module 102. The current sensor 114 is coupled between Node A and a terminal of the battery 110. For example, the current sensor 114 may be coupled between Node A and the LGND terminal of the battery 110. The current sensor 114 includes current sensor circuitry. Current sensor circuitry may include a resistor, a diode, a resistor and a diode, and/or other current sense circuitry, known to one skilled in the art. One of the resistors, R1 or R2, may be coupled between Node A and a port of battery module 102. For example, R2 is coupled between Node A and Port C in BMS 100 and R1 is coupled between Node A and Port B in BMS 150. For example, the resistors R1, R2 may be configured to provide protection, e.g., current limiting and overvoltage protection. The resistors R1, R2 may provide a voltage divider function with current sensor 114, e.g., to reduce a voltage across the current sensor 114.

The switch 116 is coupled between a battery terminal, e.g., terminal LGND, and a resistor, e.g., R1 or R2. The switch 116 is configured to be controlled by the LECU 112. For example, switch 116 may open or close based on a signal from the LECU. Closing switch 116 may close a loop and allow current to flow from a battery 110 through the switch 116, current sensor 114 and resistors R1, R2. The LECU 112 may be configured to provide the signal to open or close switch 116 based on a message from the CECU 104. The switch 116 may be a transistor, e.g., a BJT or a FET, a relay or another electronically controllable switch, known to one skilled in the art. If current is flowing, a non-zero voltage may be detected at Node A, e.g., across current sensor 114, between Node A and battery terminal LGND, by the LECU 112. If no current is flowing, e.g., switch 116 is open, zero voltage may be detected at Node A. The detected current may be used to identify and/or select one battery module in the plurality of battery modules, as described herein.

For example, for BMS 100 of FIG. 1A, when switch 116 of Module(n+2) is closed, current may flow from terminal LVCC of battery 110 of Module(n+1) through switch 116 of Module(n+2) through R1 of Module(n+2) to port B of Module(n+2), from Port B of Module(n+2) to Port C of Module (n+1), through R2 of Module(n+1) through Node A of Module (n+1) through current sensor 114 of Module(n+1) to terminal LGND of battery 110 of Module(n+1). In other words, closing a switch in a first battery module, e.g., Module (n+2), provides a first current path from a battery in a second battery module (e.g., Module (n+1)) through the switch in the first battery module (e.g., Module(n+2)) through a node and current sensor in the second battery module (e.g., Module(n+1)). The current sensor 114 in the first battery module, e.g., Module(n+2), is not included in the first current path. Rather, the current sensor 114 may be included in a second current path.

In another example, for BMS 150 of FIG. 1B, when switch 116 of Module(n+1) is closed, current may flow from terminal LVCC of battery 110 of Module(n+1) through current sensor 114 of Module(n+2) to Node A of Module(n+2), from Node A of Module(n+2) through R1 of Module(n+2) to port B of Module(n+2), from Port B of Module(n+2) to Port C of Module(n+1) through R2 of Module(n+1) through switch 116 of Module(n+1) to terminal LGND of battery 110 of Module(n+1). In other words, closing a switch in a first battery module, e.g., Module(n+1), provides a current path from a battery in the first battery module (e.g., Module(n+1)) through a current sensor and a node in a second battery module (e.g., Module(n+2)) through the switch in the first battery module (e.g., Module(n+1)).

Figure 2A:
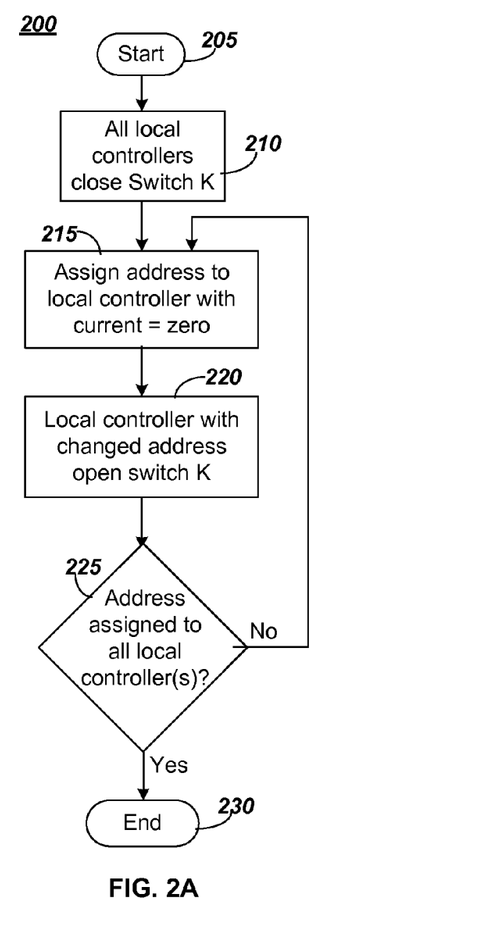
FIG. 2A depicts a flowchart of exemplary operations for a assigning addresses to a plurality of battery modules consistent with the present disclosure.

FIG. 2A depicts a flowchart 200 of exemplary operations for a assigning addresses to a plurality of battery modules consistent with the present disclosure. Program flow may begin at Start 205. At operation 210, all local controllers, e.g., all LECUs 112, in a battery management system, e.g., BMS 100 or BMS 150, may close switch K, e.g., switch 116. For example, central controller, e.g., CECU 104, may broadcast a message to each of the plurality of battery modules including an instruction to close switch K. In other words, the message may include an identifier that corresponds to all of the plurality of battery modules. In another example, each of the plurality of battery modules may be manufactured with a default address. In this example, the message from the CECU 104 may include an identifier that corresponds to the default address. In both examples, each LECU 112 in the plurality of battery modules may be configured to provide a signal to its associated switch 116 to close in response to the message from the CECU 104.

Operation 215 may include changing an address associated with a local controller that detects a zero current. For example, the LECU may be configured to detect a voltage between Node A and terminal LGND, corresponding to the current sensed by the current sensor, and if a zero voltage is detected, the LECU is configured to store a new address provided by, e.g., the CECU. The new address may be unique and may then be the identifier associated with the particular LECU in the particular battery module. Communication between the CECU and the LECU may then include this address to identify the particular battery module in the plurality of battery modules. A current below a low current threshold may be considered a zero current, as would be understood by one skilled in the art.

At operation 220, the local controller with the new address may then open switch K. For example, the LECU may receive a message including an identifier corresponding to the LECU's new address and an instruction to open its associated switch K. The LECU may then open its associated switch K in response to the message. Opening switch K in a first battery module is configured to open a current path that may include a current sensor in a second module, result in a sensed current of zero in the second battery module, as described herein. Whether all of the local controllers in a battery management system have been assigned a new, unique address may be determined at operation 225. If all of the local controllers have been assigned a new, unique address, flow may end at operation 230. If not all of the local controllers have been assigned a new, unique address, flow may proceed to operation 215, change address of local controller with detected current equal to zero and the operations may be repeated.

Figure 2B:
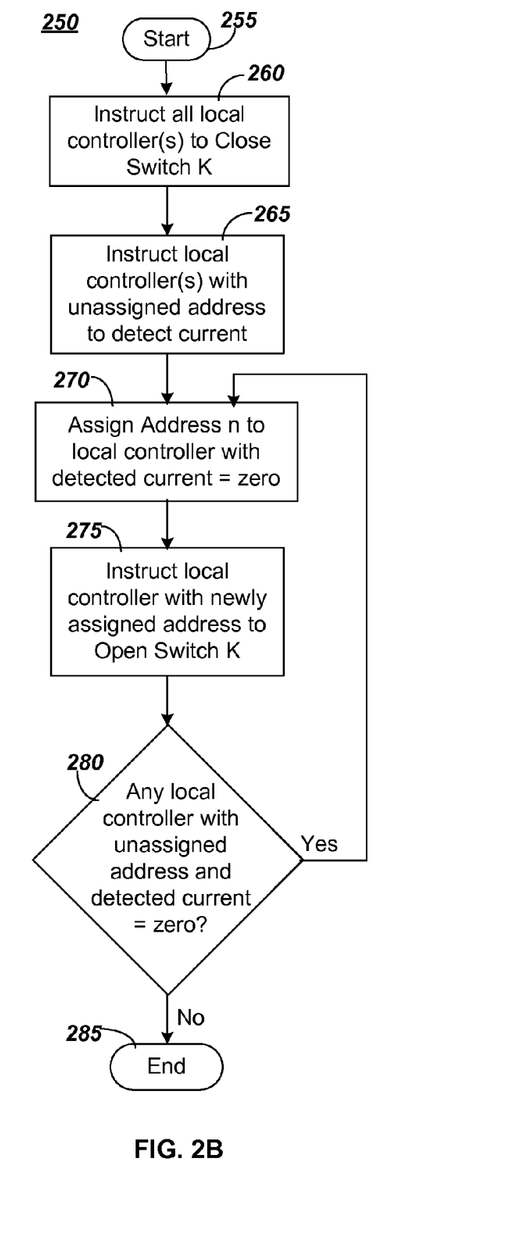
FIG. 2B depicts another flowchart of exemplary operations for a assigning addresses to a plurality of battery modules consistent with the present disclosure.

FIG. 2B depicts another flowchart 250 of exemplary operations for a assigning addresses to a plurality of battery modules consistent with the present disclosure. For example, the operations of flowchart 250 may be performed by a central controller, e.g., CECU 104. The central controller may include instructions stored in memory 124 that when executed cause the operations of flowchart 250. Flow may begin at Start 255. The central controller may transmit a message to all local controllers, e.g., LECUs, including an instruction to close switch K at operation 260. At operation 265, the central controller may then instruct the local controller(s) with unassigned addresses to detect a current, e.g., detect a potential across a current sensor coupled between Node A and terminal LGND. At operation 270, the central controller may then assign a new, unique address to the local controller that with detected current equal to zero. The central controller may then instruct the local controller with the newly assigned address to open switch K at operation 275. Whether any local controller(s) remain that have not been assigned a new, unique address and have a detected current of zero, may be determined at operation 280. If no such local controllers remain, flow may end 285. If local controller(s) remain that have not been assigned a new, unique address and have a detected current of zero, flow may proceed to operation 270 and operations 270, 275 and 280 may repeat until no local controller(s) remain with unassigned addresses.

Figure 3A:
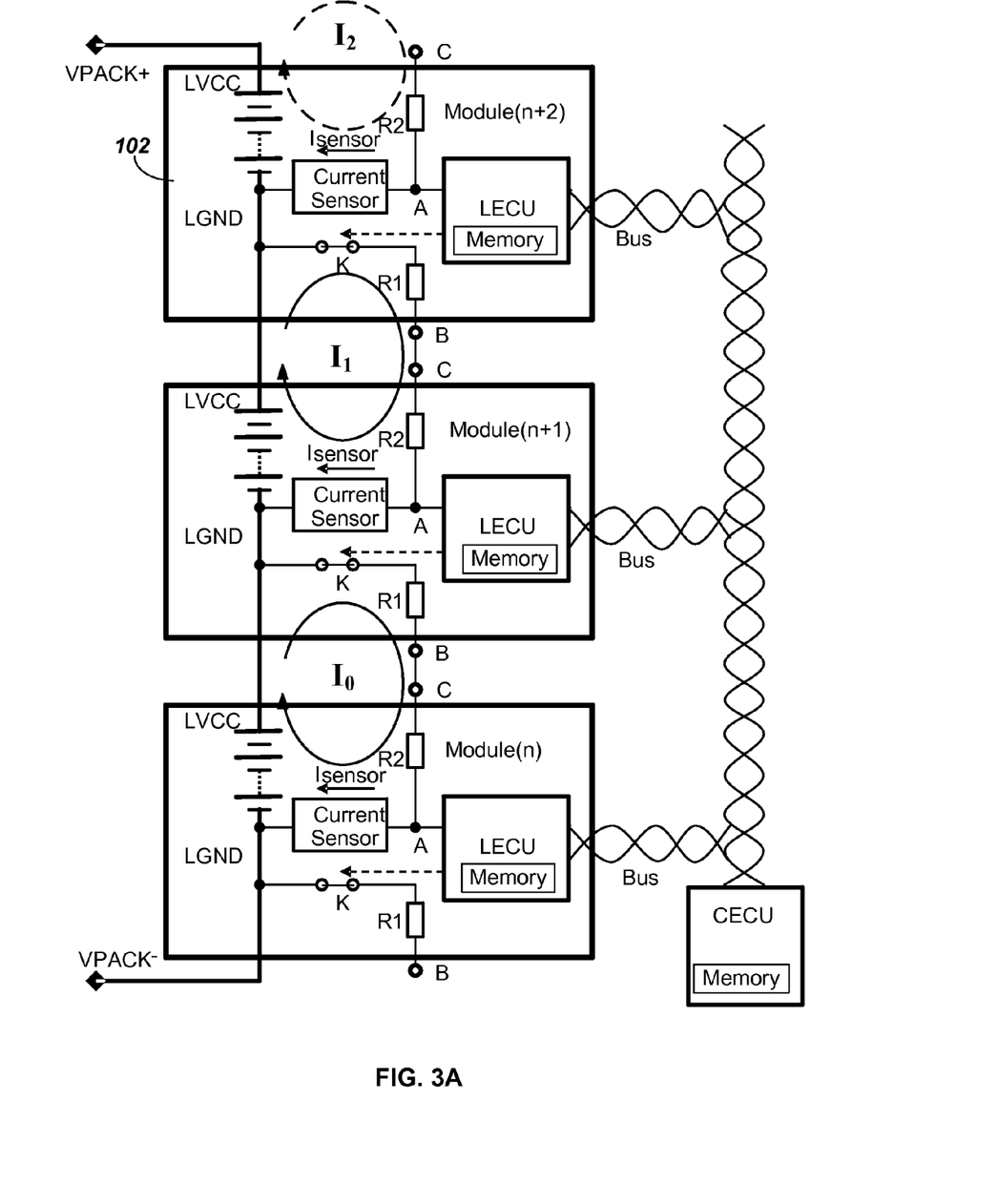
FIG. 3A illustrates current flow(s) associated with assigning addresses corresponding to the block diagram of FIG. 1A.
Figure 3B:
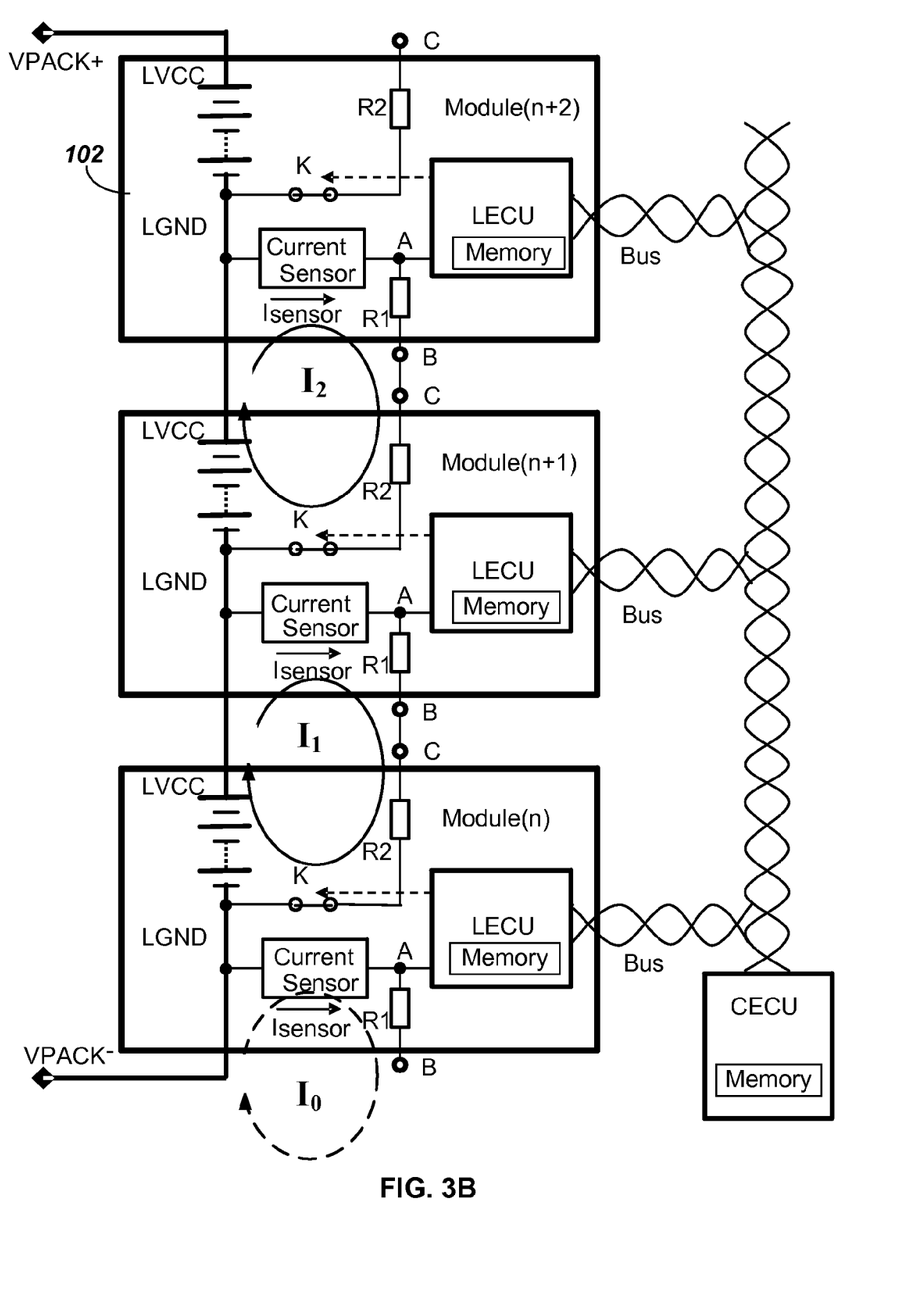
FIG. 3B illustrates current flow(s) associated with assigning addresses corresponding to the block diagram of FIG. 1B.

The operations of flowcharts 200, 250 may be better understood with reference to FIG. 3A and FIG. 3B. FIG. 3A illustrates current path(s) associated with assigning addresses corresponding to the block diagram of FIG. 1A. FIG. 3B illustrates current path(s) associated with assigning addresses corresponding to the block diagram of FIG. 1B. In both FIGS. 3A and 3B, three currents along three current paths, each path including a current sensor and a switch K in the closed state, i.e., conducting, have been added to illustrate operation of each example of a system and method consistent with the present disclosure. As should be evident to one of ordinary skill in the art, assuming LVCC is not zero, whether a current, $I_0, I_1, I_2$, sensed by current sensor 114 in a first battery module is zero depends on a state of switch 116 of a second battery module.

Referring first to FIG. 3A, beginning with operations 210, 260, all local controllers close switches, i.e., each switch 116 in an associated battery module 102 may be closed. Port C of Module (n+2) is not connected, i.e., is an open circuit. Accordingly $I_2$, sensed by the current sensor of Module (n+2), is zero. $I_1$ and $I_0$ are non-zero when switch K of Module(n+2) and switch K of Module(n+1), respectively, are closed. The sensed currents of Module(n+1) and Module(n) are non-zero. "Non-zero" may be understood as greater than an absolute value of a low current threshold. Accordingly, $I_1$, sensed by Module(n+1), depends on the state of switch K of Module(n+2). When switch K of Module(n+2) is closed, then $I_1$ may be non-zero and depends, at least in part, on LVCC of Module (n+1), R1 of Module (n+2), R2 of Module(n+1) and the current sensor of Module(n+1). Similarly, $I_0$, sensed by Module(n), depends on the state of switch K of Module(n+1). When switch K of Module(n+1) is closed, then $I_0$ may be non-zero and depends, at least in part, on LVCC of Module (n), R1 of Module (n+1), R2 of Module(n) and the current sensor of Module(n).

The address of Module(n+2) (the module with a detected current of zero) may then be changed at operation 220 and the LECU of Module(n+2) may then open switch K of Module (n+2). When switch K of Module(n+2) is opened, $I_1$ may then go to zero, $I_2$ may remain zero and $I_0$ may remain non-zero. Based on $I_1$ being zero, detected current of Module(n+1) may be zero. The address of Module(n+1) may then be changed and the LECU of Module(n+1) may then open switch K of Module(n+1), resulting in $I_0$ going to zero. A new address may then be assigned to Module(n).

The operations of flow charts 200, 250 may be performed for any number of battery modules coupled in cascade, e.g., as depicted in FIG. 1A and FIG. 3A. It may be appreciated that a "top" battery module, e.g., Module(n+2), is coupled to Vpack+. In other words, a position of Module(n+2) may be known based on detecting a zero voltage at Node A of Module (n+2) when all switches K are closed. FIG. 1A and FIG. 3A may be understood as corresponding to a discharge current method.

Referring to FIG. 3B, beginning with operations 210, 260, all local controllers close switches, i.e., each switch 116 in an associated battery module 102 may be closed. The embodiment of FIG. 3B operates similarly to the embodiment of FIG. 3A except that addresses may be assigned from the bottom, i.e., Module(n), to the top, i.e., Module(n+2), rather than from the top to the bottom. Port B of Module(n) is not connected, i.e., is an open circuit. Accordingly, $I_0$, sensed by the current sensor of Module(n), is zero, and the detected current of Module(n) is zero. $I_1$ and $I_2$ are non-zero when switch K of Module(n) and switch K of Module(n+1), respectively, are closed. The detected currents of Module(n+1) and Module (n+2) are non-zero. "Non-zero" may be understood as greater than an absolute value of a low current threshold. Accordingly, $I_1$, sensed by Module(n+1), depends on the state of switch K of Module(n). When switch K of Module(n) is closed, then $I_1$ may be non-zero and depends, at least in part, on LVCC of Module(n), R1 of Module (n+1), R2 of Module (n) and the current sensor of Module(n+1). Similarly, $I_2$, sensed by Module(n+2), depends on the state of switch K of Module(n+1). When switch K of Module(n+1) is closed, then $I_2$ may be non-zero and depends, at least in part, on LVCC of Module(n+1), R1 of Module (n+2), R2 of Module(n+1) and the current sensor of Module(n+2).

The address of Module(n) (the module with detected current equal to zero) may then be changed at operation 220 and the LECU of Module(n) may then open switch K of Module (n). When switch K of Module(n) is opened, $I_1$ may then go to zero, $I_0$ may remain zero and $I_2$ may remain non-zero. Based on $I_1$ being zero, the detected current of Module(n+1) is zero. The address of Module(n+1) may then be changed and the LECU of Module(n+1) may then open switch K of Module (n+1), resulting in $I_2$ going to zero. A new address may then be assigned to Module(n+2).

The operations of flow charts 200, 250 may be performed for any number of battery modules coupled in cascade, e.g., as depicted in FIG. 1B and FIG. 3B. It may be appreciated that a "bottom" battery module, e.g., Module(n), is coupled to Vpack–. In other words, a position of Module(n) may be known based on detecting a zero voltage at Node A of Module (n) when all switches K are closed. FIG. 1B and FIG. 3B may be understood as corresponding to a charge current method.

Figure 4A:
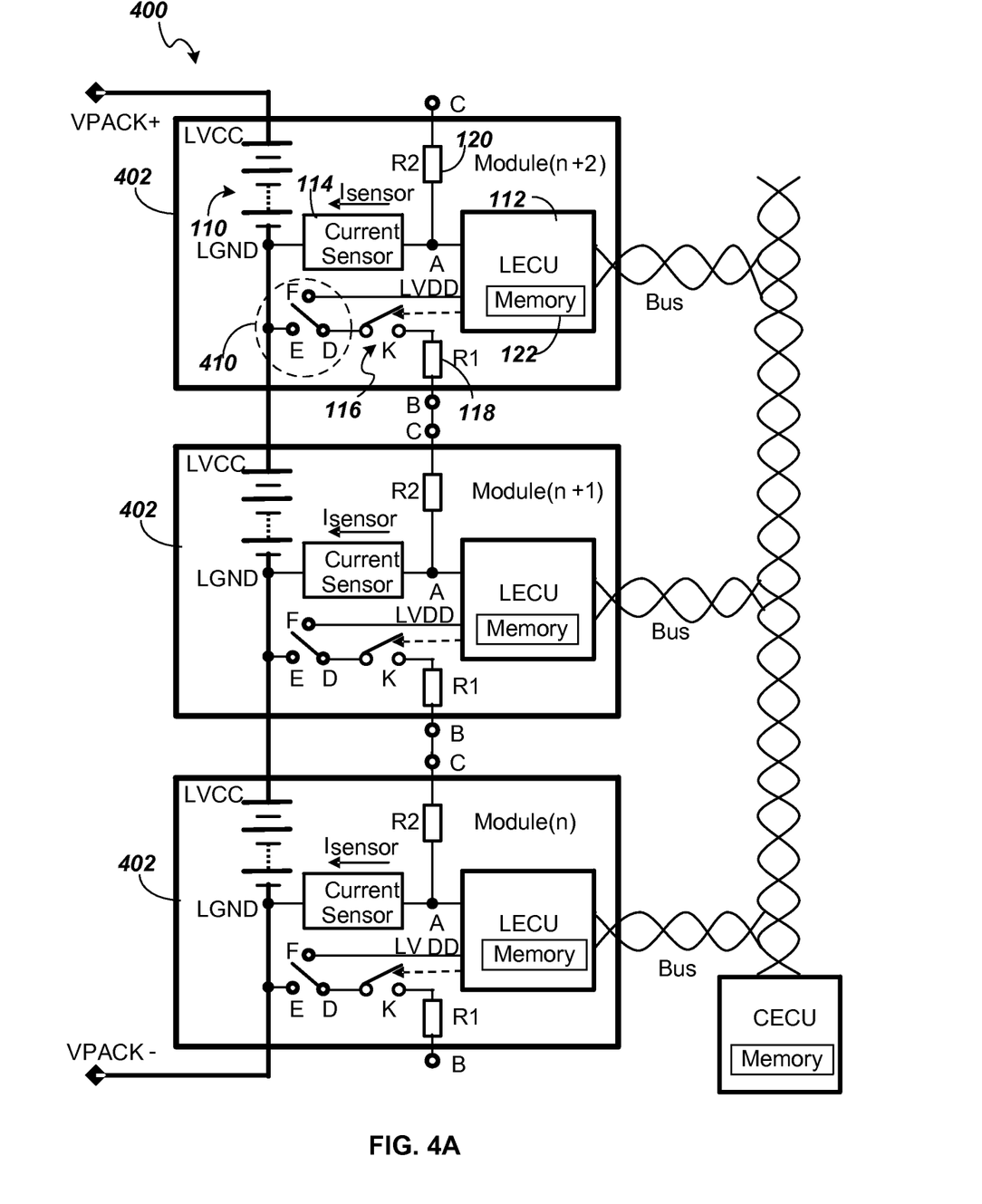
FIG. 4A depicts a block diagram of one embodiment of a system, including a second switch, consistent with the present disclosure.
Figure 4B:
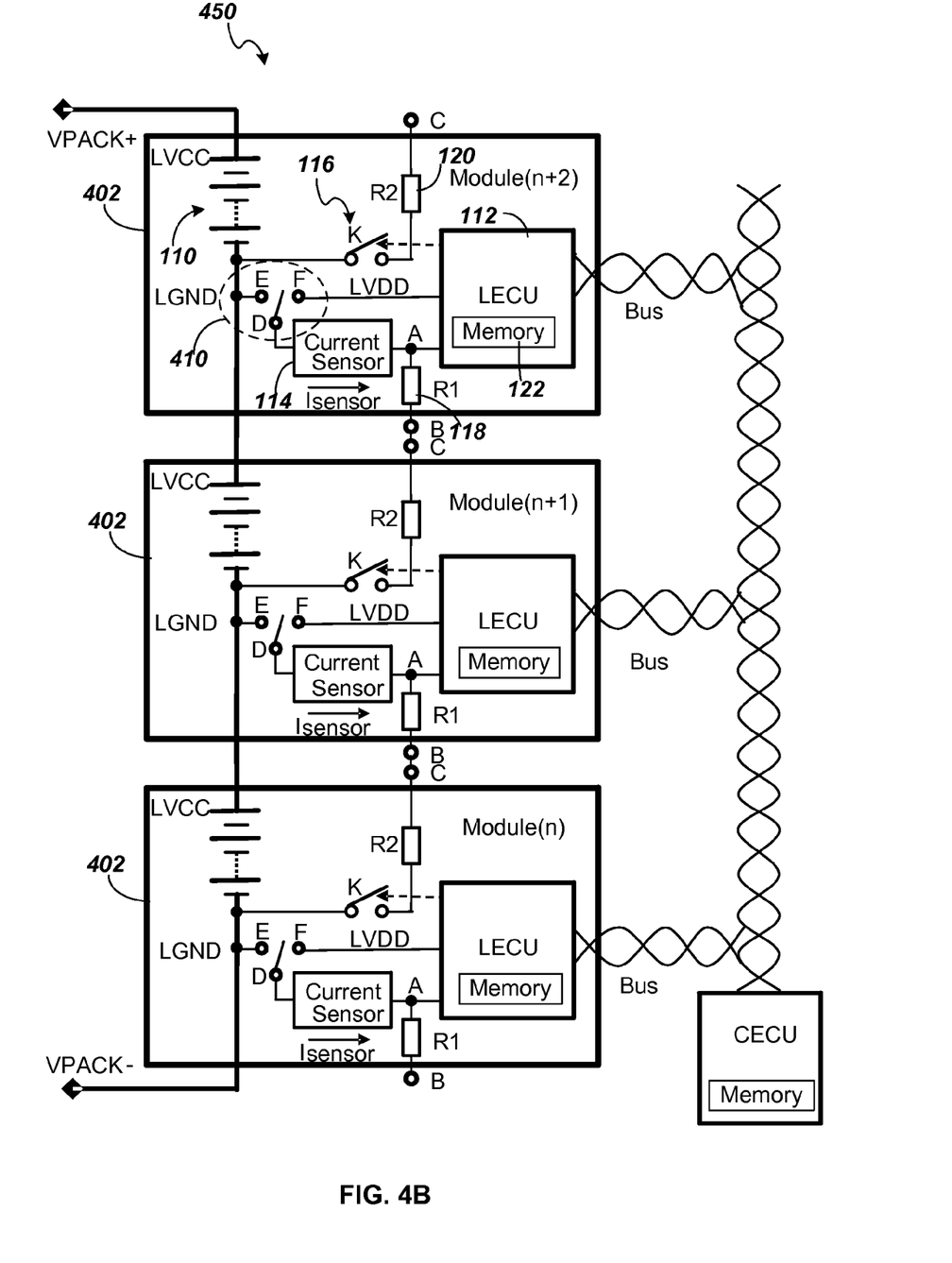
FIG. 4B depicts a block diagram of another embodiment of a system, including a second switch, consistent with the present disclosure.

FIG. 4A depicts a block diagram of one embodiment of battery management system circuitry 400, including a second switch 410, consistent with the present disclosure. FIG. 4B depicts a block diagram of another embodiment of battery management system circuitry 450, including the second switch 410, consistent with the present disclosure. In the embodiments 400, 450, common elements have common reference designators. These embodiments 400, 450 include similar elements to the embodiments 100, 150 depicted in FIG. 1A and FIG. 1B, respectively, as described herein.

The embodiments 400, 450 include a second switch 410. The switch 410 is configured to provide a potential VDD from the local controller, LECU, 112 to a current path. The potential VDD is configured to be in addition to the potential LVCC provided by the battery 110. The potential VDD may facilitate identifying specific battery modules, as described herein, when the potential LVCC provided by a battery 110 is relatively low.

Referring to FIG. 4A, the second switch 410 is coupled to switch K 116. The second switch 410 is configured to couple the switch K 116 to the local ground LGND of a battery module 402 or to an output, LVDD, of the LECU 112. When the switch K 116 is coupled to the local ground LGND, the battery system 400 may operate similarly to the battery system 100 of FIGS. 1A and 3A. When the switch K 116 is coupled to LVDD, the LECU 112 is configured to provide an additional potential to the current path that includes switch K 116. Operation is otherwise similar to the operation of the battery system 100, as described herein.

Referring to FIG. 4B, the second switch 410 is coupled to the current sensor 114. The second switch 410 is configured to couple the current sensor 114 to the local ground LGND of a battery module 402 or to an output, LVDD, of the LECU 112. When the current sensor 114 is coupled to the local ground LGND, the battery system 450 may operate similarly to the battery system 150 of FIGS. 1B and 3B. When the current sensor 114 is coupled to LVDD, the LECU 112 is configured to provide an additional potential to the current path that includes current sensor 114. Operation is otherwise similar to the operation of the battery system 150, as described herein.

Accordingly, for the embodiments depicted in FIGS. 1A, 3A and 4A and FIGS. 1B, 3B and 4B, closing all switches K results in one battery module with zero current through a current sensor and therefore zero detected current. Depending on the configuration of the battery module circuitry, this battery module may be positioned at the "top", e.g., coupled to Vpack+ or at the "bottom", e.g., coupled to Vpack– of the cascade. These techniques result in selecting a top or bottom battery module and allows assignment of an identifier, i.e., address, to the battery module. This battery module may then be independently controlled to open its associated switch, resulting in a zero voltage at a next battery module in the cascade. The process may be repeated until all of the battery modules in the cascade have been assigned a unique identifier. A count may be kept of the assigned addresses corresponding to a number, N, of battery modules in the cascade.

If the configuration of the battery module circuitry is known for all of the battery modules in the cascade, then the top or bottom module may be identified as the first battery module with zero Node A voltage. A position of each other battery module in the cascade may be identified and/or determined based on the detected current (zero or non-zero) of each other battery module. In other words, the position of each other battery module may be determined based on its position in a sequence of zero detected currents, determined according to the flow charts of FIGS. 2A and/or 2B.

Advantageously, common battery modules may be manufactured without setting individual address(es) at the time of manufacturing facilitating a lower cost and relatively faster manufacturing process. A plurality of generally identical battery modules may be assembled in cascade in a generally random order. Each battery module may then be selected and an identifier assigned, in sequence, providing a cost savings based on volume production of generally identical battery modules.

Of course, while FIGS. 2A and 2B depict exemplary operations according to some embodiments, it is to be understood that in other embodiments all of the operations depicted in FIG. 2A and/or FIG. 2B may not be necessary. Indeed, it is fully contemplated herein that other embodiments of the present disclosure may include subcombinations of the operations depicted in FIG. 2A and/or FIG. 2B and/or additional operations. Thus, claims directed to features and/or operations that are not exactly shown in one drawing are deemed within the scope and content of the present disclosure.

Memory 122, 124 may comprise one or more of the following types of memory: semiconductor firmware memory, programmable memory, non-volatile memory, read only memory, electrically programmable memory, random access memory, flash memory, magnetic disk memory, and/or optical disk memory. Either additionally or alternatively, memory 122, 124 may comprise other and/or later-developed types of computer-readable memory.

Embodiments of the methods described herein may be implemented using a processor and/or other programmable device. To that end, the methods described herein may be implemented on a tangible computer readable medium having instructions stored thereon that when executed by one or more processors perform the methods. The storage medium may include any type of tangible medium, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

Unless specifically stated otherwise, as apparent from the preceding discussions, it is appreciated that throughout the specification discussions utilizing terms such as "operations," "processing," "computing," "calculating," "determining," or the like, refer to the action and/or processes of a computer or computing system, or similar electronic computing device or apparatus, that manipulate and/or transform data represented as physical, such as electronic, quantities within the computing system's registers and/or memories into other data similarly represented as physical quantities within the computing system's memories, registers or other such information storage, transmission or display devices.

"Circuitry", as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A battery management apparatus for an electric or a hybrid electric vehicle, comprising:
    a first battery module comprising:
        a switch configured to open or close a first current path from a first terminal of a battery to a second terminal of the battery when a second battery module is coupled to the first battery module;
        a current sensor configured to sense a current in a second current path that is different from the first current path;
        a first resistor coupled to the switch, wherein the first resistor is included in the first current path;
        a second resistor coupled to the current sensor, wherein the second resistor is included in the second path; and
        a local controller configured to control a state of the switch to open or close the switch, wherein the first current path is closed when the switch is closed, the local controller is further configured to detect the sensed current in the second current path, and the local controller is further configured to receive and store an identifier based at least in part on the current detected in the second current path.

2. The apparatus of claim 1 wherein the battery is in the first battery module.

3. The apparatus of claim 1 wherein the battery is in the second battery module.

4. The apparatus of claim 1, wherein the local controller is further configured to store the identifier when the current detected in the second current path is zero.

5. The apparatus of claim 1, wherein the first battery module is configured to be coupled to a central controller via a bus and the central controller is configured to provide the identifier to the local controller.

6. A method for assigning identifiers to a plurality of battery modules of an electric or a hybrid electric vehicle, the method comprising:
    closing a switch in each battery module, wherein the switch is configured to open or close a first current path from a first terminal of a battery to a second terminal of the battery;
    detecting a current in each of the plurality of battery modules, wherein the current is in a second current path different from the first current path;
    selecting each battery module in which the current has been detected; and
    for each selected battery module:
        assigning an address to a selected battery module based at least in part on the detected current in the selected battery module, wherein the selected battery module is configured to store the assigned address, and
        opening the switch of the selected battery module.

7. The method of claim 6, further comprising determining a position of each battery module based, at least in part, on the detected current in each battery module.

8. The method of claim 6, further comprising determining a number of battery modules based, at least in part, on the detected current in each battery module.

9. The method of claim 6, further comprising receiving a message from a central controller at each selected battery module, wherein the message comprises at least one of an instruction to close at least one switch in the plurality of battery modules, an instruction to open an associated switch if the detected current for the associated battery module is zero, and the address to be assigned to the selected battery module.

10. The method of claim 6, wherein for each selected battery module, the detected current in the selected battery module is zero.

11. The method of claim 6, wherein for each selected battery module, the address is stored in a local controller in the selected battery module and corresponds to an identifier of the selected battery module.

12. A battery management system for an electric or a hybrid electric vehicle, comprising:
    a plurality of battery modules, each battery module comprising:
        a switch configured to open or close a first current path from a first terminal of a battery to a second terminal of the battery when another battery module is coupled to the battery module, a current sensor configured to sense a current in a second current path, the second current path different from the first current path, and a local controller configured to control a state of the switch to open or close the switch, wherein closing the switch is configured to close the first current path, the local controller is further configured to detect the sensed current in the second current path, and the local controller is further configured to receive and store an identifier based at least in part on the current detected in the second path; and a central controller coupled to the plurality of battery modules, wherein the central controller is configured to provide a message to the local controller of each battery module, the message is configured to cause one or more of the local controllers to close its associated local switch and to detect the current. in the second current path, the message is further configured to cause the local controller to store the identifier based at least in part on the detected current.

13. The system of claim 12, wherein the battery is in the battery module.

14. The system of claim 12, wherein the battery is in the another battery module.

15. The system of claim 12, wherein each battery module further comprises:

a first resistor coupled to the switch wherein the first resistor is included in the first current path; and a second resistor coupled to the current sensor wherein the second resistor is included in the second current path.

16. The system of claim 12, wherein the local controller is further configured to store the identifier when the detected current is zero.

17. The system of claim 12, wherein the central controller is further configured to determine a position of each battery module relative to each other battery module based, at least in part, on the detected current in each battery module.

18. The system of claim 12, wherein the central controller is further configured to determine a number of battery modules in the plurality based, at least in part, on the detected current in each battery module.

19. The system of claim 12, wherein each battery module is coupled to the central controller via a bus.

\* \* \* \* \*